(12) United States Patent
Meron et al.

(10) Patent No.: US 6,536,755 B2
(45) Date of Patent: *Mar. 25, 2003

(54) WAFER LATCH WITH A BALL BEARING ASSEMBLY

(75) Inventors: Ovadia Meron, Rego Park, NY (US); Dmitriy Genkin, Brooklyn, NY (US)

(73) Assignee: Discreet Industries Corporation, West Mineola, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/905,364

(22) Filed: Jul. 13, 2001

(65) Prior Publication Data

US 2002/0030317 A1 Mar. 14, 2002

Related U.S. Application Data

(63) Continuation of application No. 09/361,783, filed on Jul. 26, 1999, now Pat. No. 6,299,153.
(60) Provisional application No. 60/115,453, filed on Jan. 11, 1999.

(51) Int. Cl.[7] ................................................. B23Q 3/02
(52) U.S. Cl. .................... 269/91; 269/128; 269/135; 269/150; 451/365
(58) Field of Search ................... 269/91, 903, 128, 269/135, 150; 451/365; 204/298.15

(56) References Cited

U.S. PATENT DOCUMENTS

| | | | |
|---|---|---|---|
| 4,473,455 A | | 9/1984 | Dean et al. |
| 4,971,676 A | | 11/1990 | Doue et al. |
| 5,372,612 A | * | 12/1994 | Cronin et al. ............... 29/25.01 |
| 5,401,354 A | * | 3/1995 | Colucci ....................... 269/37 |
| 5,700,297 A | | 12/1997 | Vollaro |
| 5,785,307 A | | 7/1998 | Chung |
| 6,010,094 A | | 1/2000 | Csik et al. |
| 6,143,147 A | * | 11/2000 | Jelinek ................... 204/298.15 |
| 6,258,228 B1 | * | 7/2001 | Reiss ..................... 204/298.15 |
| 6,299,153 B1 | * | 10/2001 | Meron et al. ............... 269/903 |

\* cited by examiner

Primary Examiner—Lee Wilson
(74) Attorney, Agent, or Firm—Carella, Byrne, Bain, Gilfillan, Cecchi et al.; John N. Bain; William Squire

(57) ABSTRACT

A latch for securing a wafer to a clamp plate. The latch may include a bearing that couples a wheel to a horizontal shaft. The horizontal shaft is adapted to rotate relative to the clamp ring so that the wheel secures the wafer. The bearing minimizes the amount of particles generated by the moving components of the latch that may contaminant the wafer.

41 Claims, 2 Drawing Sheets

WAFER LATCH WITH A BALL BEARING ASSEMBLY

This is a continuation of U.S. patent application (application Ser. No. 09/361,783 filed Jul. 26, 1999, which has matured into U.S. Pat. No. 6,299,153, which claims the benefit of Provisional application Ser. No. 60/115,453, filed Jan. 11, 1999.

BACKGROUND OF THE INVENTION

1. Field of the Invention

The present invention relates to a latch for securing a semiconductor wafer to a clamp ring, weldment or clamp ring for use in a fabrication process.

2. Background Information

Integrated circuits are typically fabricated in a flat circular wafer that is cut from an ingot of semiconductor material. Various lithographic, sputtering, etc. processes are performed on the wafer to create the integrated circuits as is known in the art.

Each wafer is typically secured to a clamp weldment or tab ring of the fabrication equipment by a plurality of latches located about the ring. Each latch may have a roller wheel that is rolled onto the wafer to press the outer wafer edge into the ring. The roller wheel rotates about a horizontal shaft that extends from a latch body. The latch body can swivel about a post that is vertically mounted to the ring. The latch body can be rotated to move the roller wheel between a latched position and an unlatched position.

Because of high temperatures and the migration of material being sputtered onto the wafer it has been found that the roller wheel will drag and stick when the latch is moved to the latched position. This drag increases friction and may create particles that contaminate the wafer. It would be desirable to provide a wafer clamp that minimizes the amount of roller wheel drag and contaminants produced by the clamp.

SUMMARY OF THE INVENTION

An embodiment of the present invention may include a latch for securing a wafer to a substrate such as a clamp plate. The latch weldment or tab ring of a wafer holder may include a bearing that allows relative movement between a first element and a second element.

DETAILED DESCRIPTION

Figure 1:
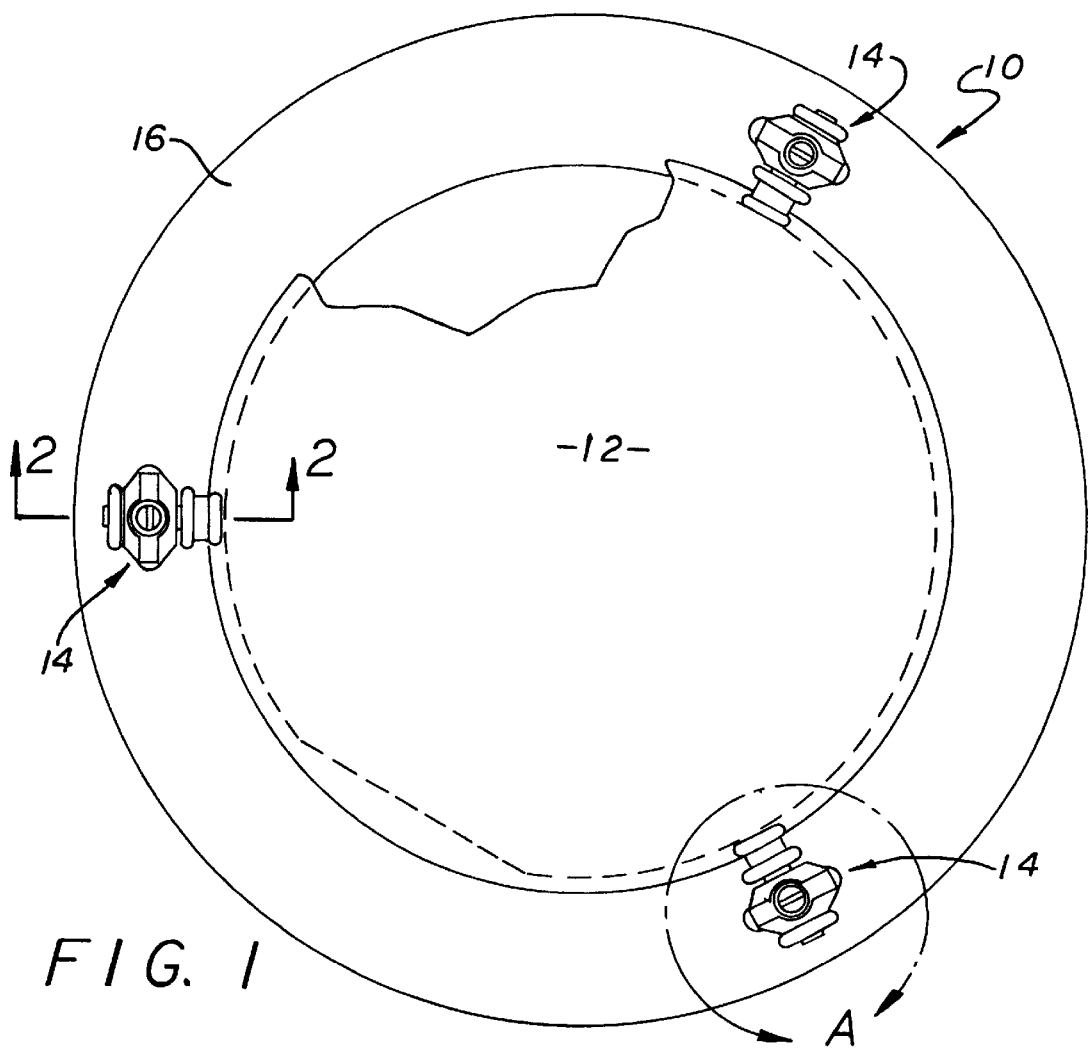
FIG. 1 is a perspective view of an embodiment of a clamp assembly of the present invention.

Referring to the drawings more particularly by reference numbers, FIG. 1 shows a wafer holder assembly 10 of the present invention. The wafer holder assembly 10 may be assembled into semiconductor fabrication equipment (not shown). The assembly 10 may secure a wafer 12 during one or more fabrication processes. By way of example, the fabrication process may include oxidation, gaseous deposition, ion implantation, metal deposition, sputtering, electron beam exposure and gaseous etching.

The wafer holder assembly 10 may include a plurality of latches 14 that are mounted to a clamp plate 16. Alternatively, the latches may be mounted to a weldment or tab ring (not shown). The latches 14 may be equally spaced about the plate 16 to secure the edges of the wafer 12. The clamp plate 16 may be assembled into the fabrication equipment.

Figure 2:
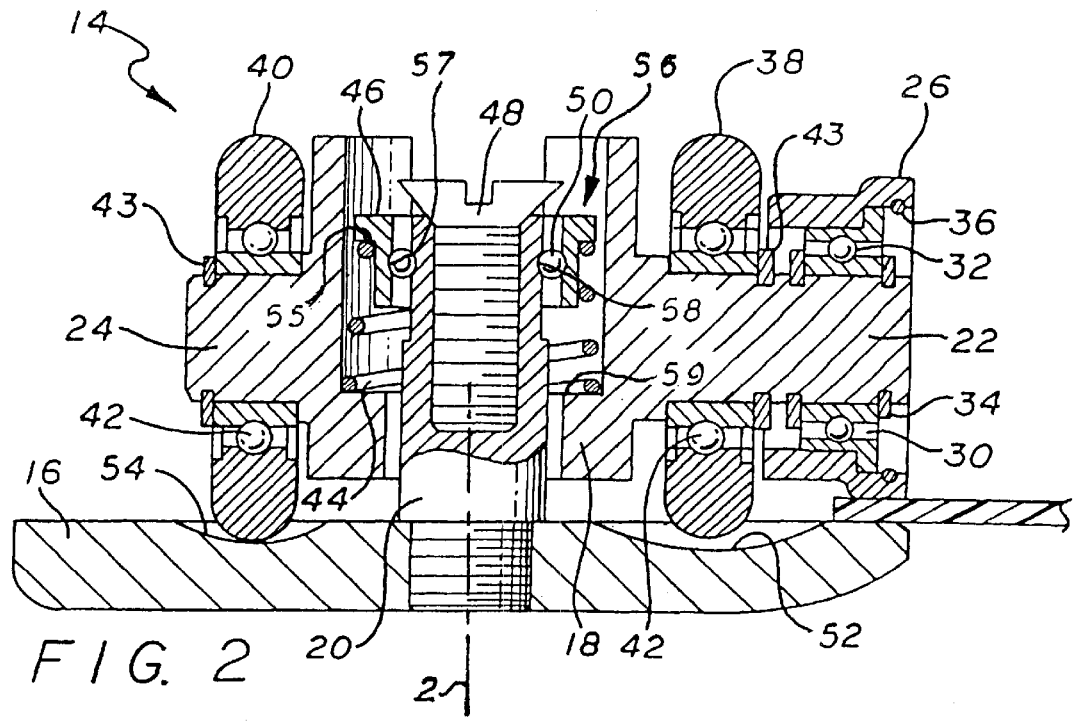
FIG. 2 is a cross-sectional view of a latch of the assembly.

FIG. 2 shows an embodiment of a latch 14. The latch 14 may include a body 18 that is pivotally connected to a post 20. The post 20 may be screwed into the clamp plate 16. The body 18 may include a first horizontal shaft 22 and a second horizontal shaft 24. The clamp 14 may include a wheel 26 that can rotate about the first horizontal shaft 22. The wheel 26 may be coupled to the horizontal shaft 22 by a wheel bearing 30. The wheel bearing 30 may include ball bearings 32 that allow relative movement between the wheel 26 and the shaft 22. The bearing 32 reduces the friction and amount of particles that can be generated when the wheel 26 rotates about the shaft 22.

The bearing 30 can be coupled to the shaft 22 by a pair of clips 34. The wheel 26 can be coupled to the shaft 22 by clip 36.

The latch 14 may include a first roller wheel 38 that is coupled to the first horizontal shaft 22 and a second roller wheel 40 coupled to the second horizontal shaft 24. The roller wheels 38 and 40 can roll along the clamp plate 16 when the body 18 is rotated about the post 20. Each roller wheel 38 and 40 may include ball bearings 42 to minimize the frictional contact between the wheels 38 and 40 and the shafts 22 and 24, respectively. The roller wheels 38 and 40 may be secured to the shafts 22 and 24 by clips 43.

The body 18 is coupled to the post 20 by a spring 44, a ball bearing assembly 56 and a screw 48. The post 20 has a longitudinal axis 2. The spring 48 allows vertical movement of the body 18 and the roller wheels 38 and 40 relative to the bearing assembly 56 and the post 20. The bearing assembly 56 comprises an outer race 46 having a radially inwardly facing channel 57, an inner race formed by a radially outwardly facing channel 58 in the outer surface of the post 20 aligned with channel 57 and ball bearings 50 captured to the channels 57 and 58. The channels 57 and 58 and the bearings 50 thus fix the axial position of the bearing assembly 56 to the post 20 along the axis 2.

The outer race 46 has a shoulder 55. The spring 44 abuts the shoulders 55 and 59 thereby permitting the relative axial displacement of the body 18 to the post 20 and bearing assembly 56 parallel to axis 2. The bearing assembly 56 also allows the body 18 to rotate about the post 20 axis 2.

The clamp plate 16 may have a first detent indentation 52 and a second detent indentation 54. The body 18 can be rotated so that the first roller wheel 38 is located within the first indentation 52, the second wheel 40 is within the second indentation 54 and the wheel 26 presses the wafer 12. The first indentation 52 may have a depth that is greater than the second indentation 54 so that the first wheel 38 does not interfere with the wheel 26 pressing onto the wafer 12.

Figure 3:
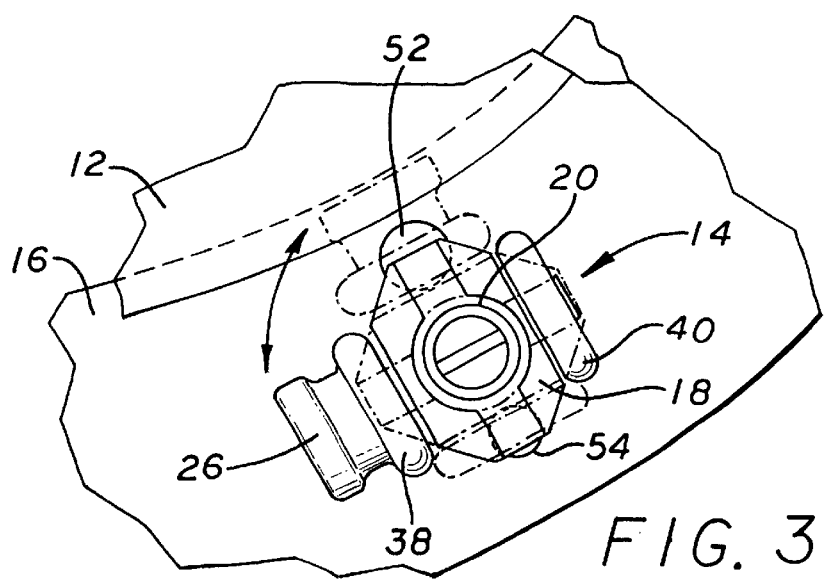
FIG. 3 is an enlarged top view showing a latch rotated relative to a clamp plate.

Referring to FIG. 3, in operation, each latch 14 is rotated so that the wheels 38 and 40 are not within the indentations 52 and 54. This allows the wafer 12 to be placed onto the clamp plate 16. The body 18 is then rotated about the post 20 until the roller wheels 38 and 40 roll into the indentations 52 and 54, respectively. Rotation of the body 18 also rolls the wheel 26 onto the wafer 12 to secure the same.

Figure 4:
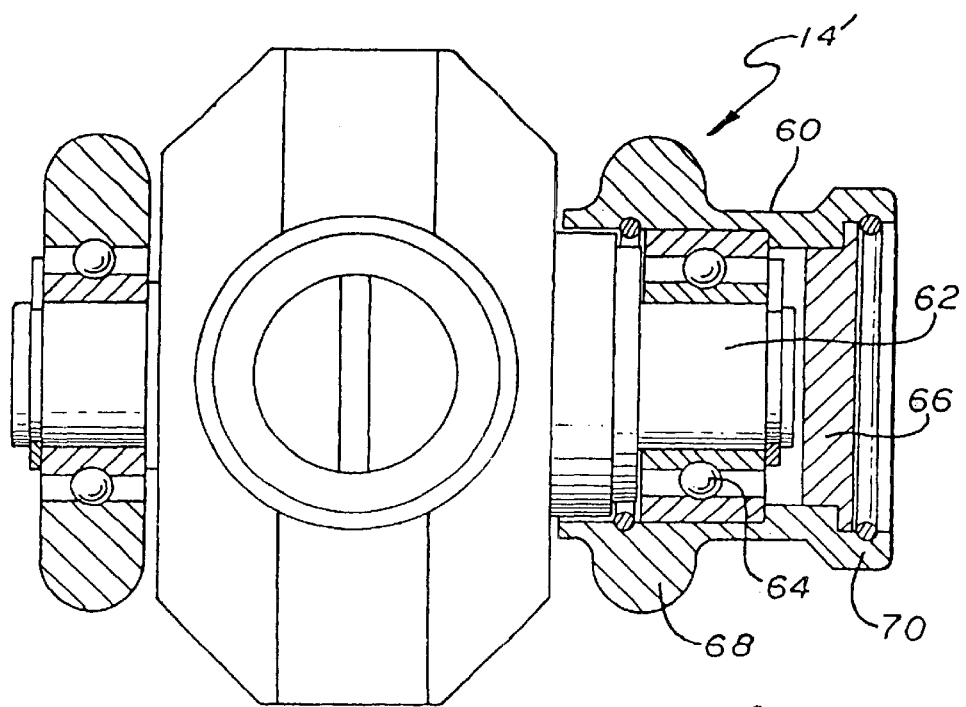
FIG. 4 is a cross-sectional view of an alternate embodiment of a latch.

FIG. 4 shows an alternate embodiment of a clamp 14' wherein the clamp wheel and first roller wheel are integrated into one wheel 60. The wheel 60 is coupled to a first horizontal shaft 62 by a bearing assembly 64. The bearing assembly 64 may be sealed by a cap 66. The roller bearing wheel 60 may have a roller portion 68 that can roll along the clamp plate 16 and a clamp portion 70 that can roll onto the wafer 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A latch for securing a wafer, comprising:
   a post;
   a body including a first shaft and a second shaft;
   at least one ball bearing coupled to said post, the at least one ball bearing comprising a first part rotatable relative to the post and a plurality of bearing balls captured between the first part and the post, the first part being radially spaced from the post by said balls; and
   a spring coupled to said bearing first part and to said body.
2. The latch of claim 1 wherein said spring is a coil spring.
3. The latch of claim 1 further comprising:
   a first wheel; and
   a bearing coupled to said first shaft and said first wheel.
4. The latch of claim 3, wherein said first wheel is a roller wheel.
5. The latch of claim 4 further comprising:
   a second wheel; and
   a bearing coupled to said second wheel and said second shaft.
6. The latch of claim 5, wherein said second wheel is a roller wheel.
7. The latch of claim 1 further comprising:
   a roller wheel; and
   a bearing coupled to said first shaft and said roller wheel.
8. The latch of claim 1 wherein said bearing balls are in physical contact with said post and said spring is in physical contact with both said bearing first part and with said body.
9. A latch for securing a wafer to a support having a plurality of detent recesses, comprising:
   a post defining a longitudinal axis;
   means for securing the post to the support;
   a first shaft rotatably secured to the post for rotation about the longitudinal axis;
   a wafer clamping wheel rotatably secured to the first shaft for rotating about the shaft and arranged to releasably clamp the wafer to the support; and
   a first ball bearing for rotationally coupling the wafer clamping wheel to the first shaft.
10. The latch of claim 9 further comprising a first roller wheel rotatably coupled to the first shaft for rotation about the first shaft with a second ball bearing and positioned to selectively engage a first of said detent recesses.
11. The latch of claim 9 including a second wheel attached to the wafer clamping wheel and rotatably attached to the first shaft by the first ball bearing.
12. The latch of claim 9 including a second shaft secured to the first shaft for rotation about the post, a first roller wheel for rotation about the first shaft and a second roller wheel for rotation about the second shaft, the first and second roller wheels being coupled for rotation about the respective first and second shafts by respective second and third ball bearings.
13. The latch of claim 12 wherein the first roller wheel is arranged for selective engagement and disengagement with a first of said detent recesses.
14. The latch of claim 13 wherein the second roller wheel is arranged for selective engagement and disengagement with a second of said detent recesses.
15. The latch of claim 13 wherein the first and second roller wheels and first and second recesses are arranged to selectively engage and disengage the wafer clamping wheel from the wafer in response to the engagement and disengagement of the first and second roller wheels from the respective first and second recesses.
16. The latch of claim 12 including a body, the first and second shafts being secured to the body, and a fourth ball bearing secured to and between the post and body for rotationally coupling the body to the post for rotation about the post longitudinal axis.
17. The latch of claim 16 wherein the fourth ball bearing includes an inner race and an outer race and a plurality of bearing balls coupled to and between the inner and outer races, the inner race being coupled to the post, and a spring coupled between the body and the outer race for urging the body in an axial direction parallel to said longitudinal axis.
18. The latch of claim 17 wherein the post has opposing first and second ends, the first end for abutting the support, said mounting means comprising a screw coupled to the post, the fourth bearing being in fixed axial relation to the post along the longitudinal axis adjacent to the second end, the body having a shoulder axially spaced from the fourth bearing along said longitudinal axis, the spring for abutting the outer race and said shoulder for urging the body toward the first end.
19. A latch for securing a wafer to a support having a plurality of detent recesses, comprising:
   a post defining a longitudinal axis;
   means for securing the post to the support;
   a body having a shoulder;
   a first shaft secured to the body extending transverse to the longitudinal axis;
   a ball bearing assembly having an inner race and an outer race coupled in fixed axial position to the post axially spaced from the body shoulder and including a plurality of bearing balls captured to the inner and outer race;
   a spring between and abutting the shoulder and outer race for resiliently securing the body to the outer race to thereby secure the body and spring for rotation about the post longitudinal axis, the spring for biasing the body in a direction away from the ball bearing assembly; and
   a wafer clamping wheel rotatably secured to the first shaft for rotation about the shaft and for clamping the wafer to the support.
20. The latch of claim 19 including a second shaft extending transverse to the longitudinal axis and first and second roller wheels, the first roller wheel rotatably secured for rotation about the first shaft and the second roller wheel for rotation about the second shaft, the first and second roller wheels for selective engagement to a different one of said detent recesses to selectively cause the wafer clamping wheel to engage the wafer.
21. The latch of claim 20 including a ball bearing corresponding to the first and second roller wheels for rotatably securing the first and second roller wheels to their corresponding first and second shafts.

22. A latch for securing a wafer to a support, comprising:

a post defining a longitudinal axis;

means for securing the post to the support;

a first shaft rotatably secured to the post for rotation about the longitudinal axis;

a wafer clamping wheel rotatably secured to the first shaft for rotating about the shaft and arranged to releasably clamp the wafer to the support;

a first roller wheel; and a first ball bearing for rotationally coupling the first roller wheel to the first shaft for rotation about the shaft.

23. The latch of claim 22 including a second ball bearing for rotationally coupling the wafer clamping wheel to the first shaft.

24. The latch of claim 22 wherein the first roller wheel and wafer clamping wheel are one piece integral material such that the first ball bearing rotationally secures both the first roller wheel and the wafer clamping wheel to the first shaft.

25. The latch of claim 22 including a second shaft, a second roller wheel, and a second ball bearing for rotatably securing the second roller wheel to the second shaft for rotation about the second shaft.

26. The latch of claim 25 including a third ball bearing for securing the wafer clamping wheel for said rotation of the wafer clamping wheel about the first shaft.

27. The latch of claim 22 including a second ball bearing for rotatably securing the first shaft to the post.

28. The latch of claim 27 wherein the second ball bearing comprises an inner race, an outer race and a plurality of bearing balls captured to the inner and outer race.

29. The latch of claim 28 including a spring coupled to the first shaft and outer race to resiliently secure the first shaft to the post for resilient displacement in a direction parallel to the longitudinal axis.

30. The latch of claim 29 wherein the post has first and second opposing ends, the first end for abutting the support, the inner race being positioned adjacent to the second end, the spring being coupled to the shaft and second ball bearing for biasing the first shaft and second ball bearing apart.

31. The latch of claim 30 including a body, the first shaft being secured to the body, the spring being coupled to and between the body and the outer race for said biasing the first shaft and second ball bearing apart.

32. The latch of claim 22 including a body, a second shaft secured to the body, the body being secured to the first shaft, and further including a second roller wheel rotatably secured to the second shaft by a second ball bearing and a third ball bearing for rotatably securing the body to the post for rotation about the post longitudinal axis and thereby rotatably securing the first and second shafts for rotation about the post longitudinal axis.

33. A latch assembly for securing a wafer to a support, comprising:

a support; and a latch secured to the support, the latch comprising:

a post defining a longitudinal axis and secured to the support;

a body having a shoulder;

a first shaft secured to the body extending transverse to the longitudinal axis;

a ball bearing including first and second parts secured for relative rotation to each other and coupled in fixed axial position to the post axially spaced from the body shoulder, the first part abutting the post, the second part being rotatable relative to the second part about the post axis;

a spring between and abutting the shoulder and the second part for resiliently securing the body to the ball bearing and to secure the body and spring for rotation about the post longitudinal axis, the spring for biasing the body in a direction away from the ball bearing; and a wafer clamping wheel rotatably secured to the first shaft for rotation about the shaft and for clamping the wafer to the support.

34. A wafer holding assembly for securing a wafer, comprising:

a clamp plate adapted to support the wafer; and at least one latch including:

a post;

a first shaft adapted to rotate about the post;

a wheel adapted to rotate about said first shaft and to clamp the wafer to the clamp plate; and a first ball bearing coupling the wheel to the shaft.

35. The wafer holding assembly of claim 34, wherein said wheel is a first roller wheel.

36. The wafer holding assembly of claim 34, further comprising a first roller wheel coupled to said first shaft via a second bearing.

37. The wafer holder assembly of claim 35, further comprising a second shaft adapted to rotate about said post and a second roller wheel coupled to said second shaft.

38. The wafer holder assembly of claim 37, wherein said first and second shafts extend from said post in a substantial horizontal orientation.

39. The wafer holder assembly of claim 37, wherein said first roller wheel can roll into a first detent indentation of said clamp plate.

40. The wafer holder assembly of claim 39, wherein said second roller wheel can roll into a second detent indentation of said clamp plate.

41. The wafer holder assembly of claim 40, wherein said first detent indentation has a depth greater than said second detent indentation.

* * * * *